United States Patent
Akarvardar et al.

(10) Patent No.: US 12,144,268 B2
(45) Date of Patent: Nov. 12, 2024

(54) SEMICONDUCTOR STRUCTURE AND METHOD OF MANUFACTURE

(71) Applicant: Taiwan Semiconductor Manufacturing Company Limited, Hsin-Chu (TW)

(72) Inventors: Kerem Akarvardar, Palo Alto, CA (US); Yu Chao Lin, Hsinchu (TW); Wei-Sheng Yun, Taipei (TW); Shao-Ming Yu, Zhubei (TW); Tzu-Chiang Chen, Hsinchu (TW); Tung Ying Lee, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 450 days.

(21) Appl. No.: 17/671,731

(22) Filed: Feb. 15, 2022

(65) Prior Publication Data
US 2023/0263081 A1  Aug. 17, 2023

(51) Int. Cl.
*H10N 70/00* (2023.01)
*H10N 70/20* (2023.01)

(52) U.S. Cl.
CPC ....... *H10N 70/8418* (2023.02); *H10N 70/066* (2023.02); *H10N 70/231* (2023.02); *H10N 70/826* (2023.02)

(58) Field of Classification Search
CPC ...................................... H10N 70/00
See application file for complete search history.

(56) References Cited

U.S. PATENT DOCUMENTS

2010/0044669 A1  2/2010  Happ et al.

FOREIGN PATENT DOCUMENTS

TW          202125854 A     7/2021

*Primary Examiner* — Marvin Payen
(74) *Attorney, Agent, or Firm* — Cooper Legal Group, LLC

(57) ABSTRACT

A semiconductor structure includes a first dielectric layer, an electrode in the first dielectric layer, a second dielectric layer in the electrode, and a phase change material over the first dielectric layer, the electrode, and the second dielectric layer. According to some embodiments, an uppermost surface of the electrode is at least one of above an uppermost surface of the first dielectric layer, above an uppermost surface of the second dielectric layer, or above a lowermost surface of the phase change material.

20 Claims, 11 Drawing Sheets

SEMICONDUCTOR STRUCTURE AND METHOD OF MANUFACTURE

BACKGROUND

Semiconductor structures are used in a multitude of electronic devices, such as consumer products, industrial electronics, appliances, aerospace devices, and transportation devices. Some semiconductor structures include non-volatile memory devices. A phase change memory device is a type of non-volatile memory where a binary state of a memory cell of the memory device is dependent on the phase or state of a phase change material of the memory cell. The phase change material generally has two states, such as an amorphous state and a crystalline state. The memory cell is generally regarded as having a first logic state, such as a logic 0, when the phase change material is in a first state, such as the amorphous state. The memory cell is generally regarded as having a second logic state, such as a logic 1, when the phase change material is in a second state, such as the crystalline state. A reset current is applied to the memory cell to transition the phase change material between different states, and thus to control the state of the memory cell. The state of the memory cell generally remains fixed unless/until a reset current is applied to the memory cell, and thus the memory cell is regarded as non-volatile.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
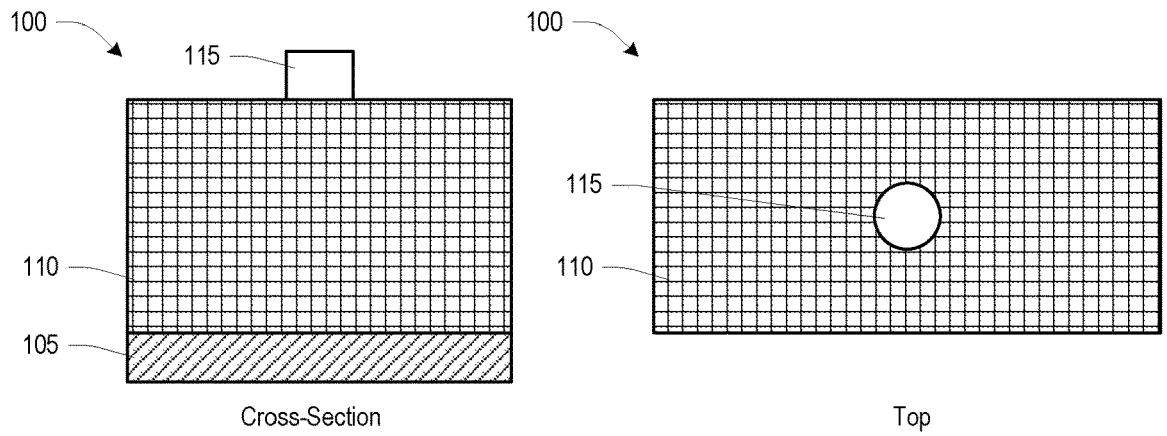
FIGS. 1A-1H are illustrations of a semiconductor structure at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to one or more semiconductor structures and/or one or more methods for fabricating one or more semiconductor structures. According to some embodiments, a semiconductor structure comprises a memory cell, such as of a phase change memory device. According to some embodiments, the memory cell comprises an electrode that contacts a phase change material. The electrode comprises a base and an edge portion extending from the base and terminating in a tip portion. In some embodiments, the edge portion is formed by recessing the electrode. In some embodiments, the edge portion is formed by forming a conformal layer in a recess and exposing at least some of the conformal layer. The tip portion concentrates current in the phase change material, thereby decreasing current required to change a state of the memory cell, such as to reset the memory cell.

FIGS. 1A-1H are illustrations of a semiconductor structure 100 at various stages of fabrication, in accordance with some embodiments. FIGS. 1A-1H include cross-sectional views and top views of the semiconductor structure 100. Referring to FIG. 1A, a lower conductive structure 105 is formed, a conductive layer 110 is formed over the lower conductive structure 105, and a mask 115 is formed over the conductive layer 110. In some embodiments, the lower conductive structure 105 comprises a metallization layer, a barrier layer, a seed layer, a metal fill layer, and/or other suitable layers. According to some embodiments, the lower conductive structure 105 includes one or more active devices, such as transistors, resistors, and/or other devices, formed in one or more layers with one or more layers of metal interconnecting at least some of the active devices. In some embodiments, the lower conductive structure 105 comprises tungsten, aluminum, copper, cobalt, and/or other suitable materials. The one or more layers of the lower conductive structure 105 may be formed by at least one of atomic level deposition (ALD), physical vapor deposition (PVD), chemical vapor deposition (CVD), atomic layer CVD (ALCVD), low pressure CVD (LPCVD), ultrahigh vacuum CVD (UHVCVD), reduced pressure CVD (RPCVD), molecular beam epitaxy (MBE), liquid phase epitaxy (LPE), spin coating, thermal evaporation, plating, or other suitable techniques. The conductive layer 110 may comprise at least one of TiN, TaN, TiSiN, fullerenes, graphene, or other suitable materials. The conductive layer 110 may be formed by at least one of ALD, PVD, CVD, thermal evaporation, or other suitable techniques.

According to some embodiments, the mask 115 comprises a plurality of individually formed layers that together define a mask stack. In some embodiments, the mask 115 comprises at least one of a hard mask layer, a bottom antireflective coating (BARC) layer, an organic planarization layer (OPL), or a photoresist layer. The hard mask layer is formed by at least one of PVD, CVD, spin on, growth, or other suitable techniques. In some embodiments, the hard mask layer comprises at least one of silicon (e.g., polycrystalline silicon), oxygen, nitrogen, or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. The layers of the mask stack are patterned to define the mask 115. In some embodiments, the photoresist layer is exposed using a radiation source and a reticle to define a pattern in the photoresist layer, and portions of the photoresist layer are removed to define a patterned photoresist layer. The underlying OPL, BARC layer, and hard mask layer are etched using the patterned photoresist layer as a template to form the mask 115 and expose portions of the conductive layer 110 under the mask 115.

Figure 1B:
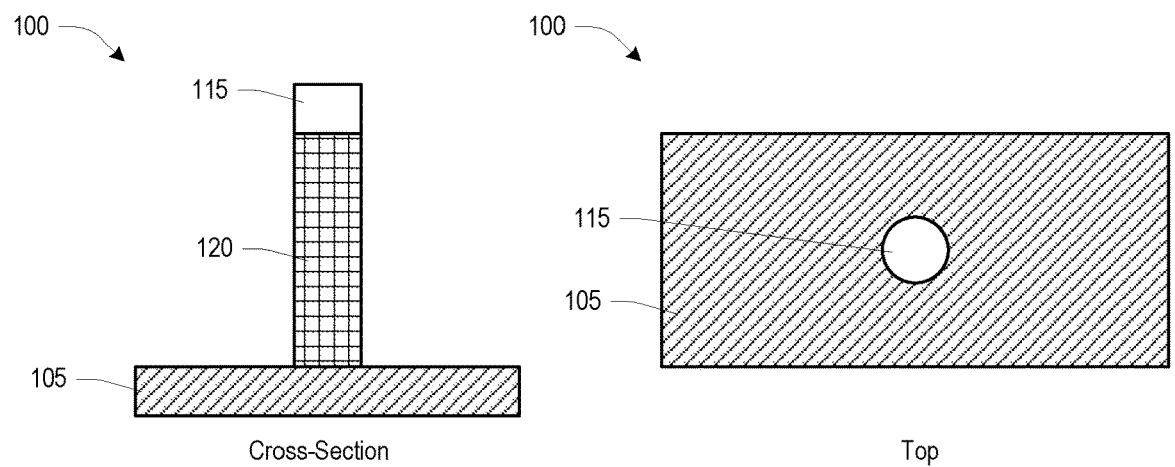

Referring to FIG. 1B, the conductive layer 110 is patterned using the mask 115 as a removal template to form an electrode 120, in accordance with some embodiments. The electrode 120 may have an elliptical cross-section, such as a circular cross-section, or a rectangular cross-section, such as a square cross-section. Other structures and/or configurations of the electrode 120 are within the scope of the present disclosure.

Figure 1C:
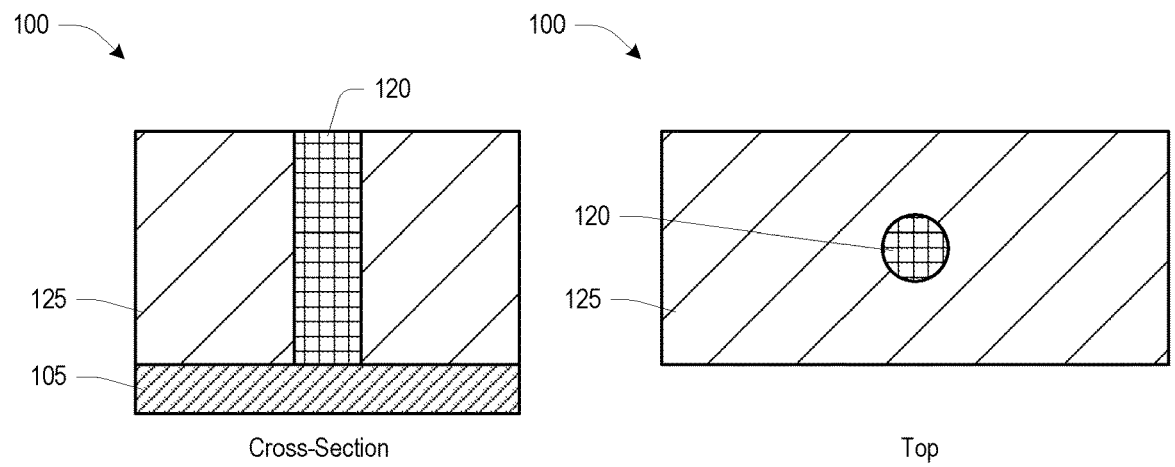

Referring to FIG. 1C, a dielectric layer 125 is formed over the electrode 120 and the mask 115 is removed, in accordance with some embodiments. The mask 115 may be removed by acid washing, a selective etch process, such as a wet etch process, and/or other suitable techniques. The dielectric layer 125 comprises silicon dioxide, a low-k dielectric material, one or more layers of low-k dielectric material, and/or other suitable materials. Low-k dielectric materials have a k value lower than about 3.9. The materials for the dielectric layer 125 comprise at least one of Si, O, C, or H, such as SiCOH and SiOC, or other suitable materials. Organic material such as polymers may be used for the dielectric layer 125. The dielectric layer 125 may comprise at least one of a carbon-containing material, organo-silicate glass, a porogen-containing material, nitrogen, and/or other suitable materials. The dielectric layer 125 may be formed by at least one of LPCVD, ALCVD, spin-on technology, or other suitable techniques. In some embodiments, the dielectric layer 125 is formed above the electrode and the mask 115 and a planarization process is performed to remove portions of the dielectric layer 125 and the mask 115, where the planarization process is terminated upon exposure of the electrode 120.

Figure 1D:
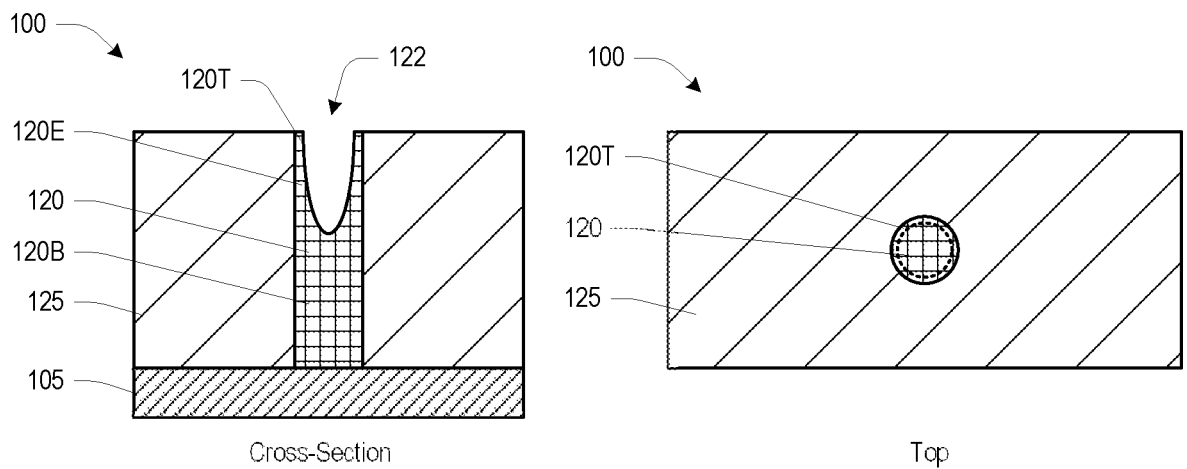

Referring to FIG. 1D, the electrode 120 is recessed, in accordance with some embodiments. The electrode 120 may be recessed using at least one of etching with silicon tetrafluoride ($SiF_4$), etching with hydrogen chloride ($HCl_2$), etching with hydrogen sulfide ($H_2S$), etching with silicon tetrachloride ($SiCl_4$), etching with oxygen ($O_2$), etching with nitrogen ($N_2$), etching with chlorine ($Cl_2$), wet etching, or other suitable techniques. A recess 122 is formed in the electrode 120. The recess 122 may have a tapered sidewall with a non-uniform slope as a result of the non-uniform etch process. The electrode 120 comprises a base portion 120B and an edge portion 120E extending from the base portion 120B and terminating in a tip portion 120T.

Figure 1E:
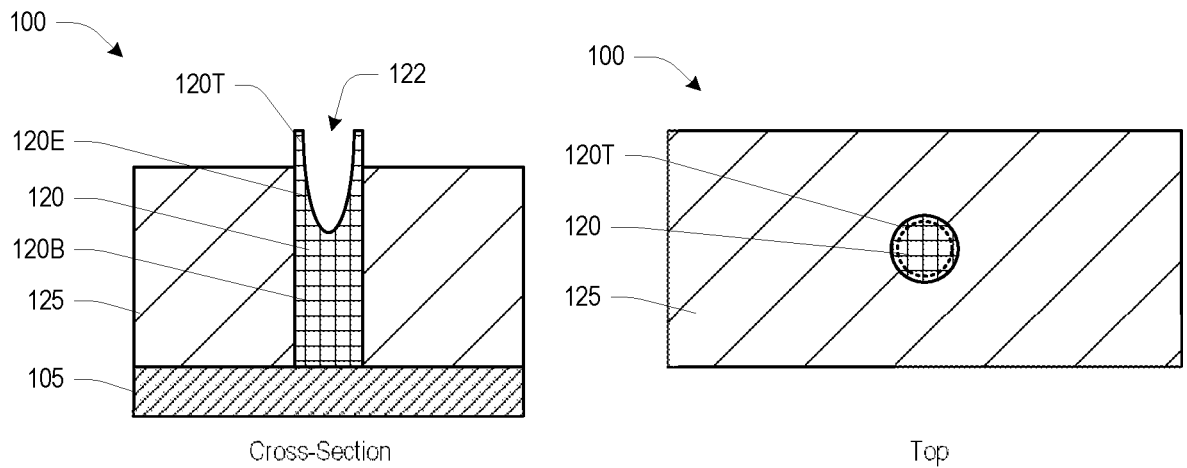

Referring to FIG. 1E, the dielectric layer 125 is recessed, in accordance with some embodiments. In some embodiments, an etch process, such as a reactive ion etch, is performed to recess the dielectric layer 125. The etch process may be a timed etch that is configured to terminate after exposing a portion of the edge portion 120E.

Figure 1F:
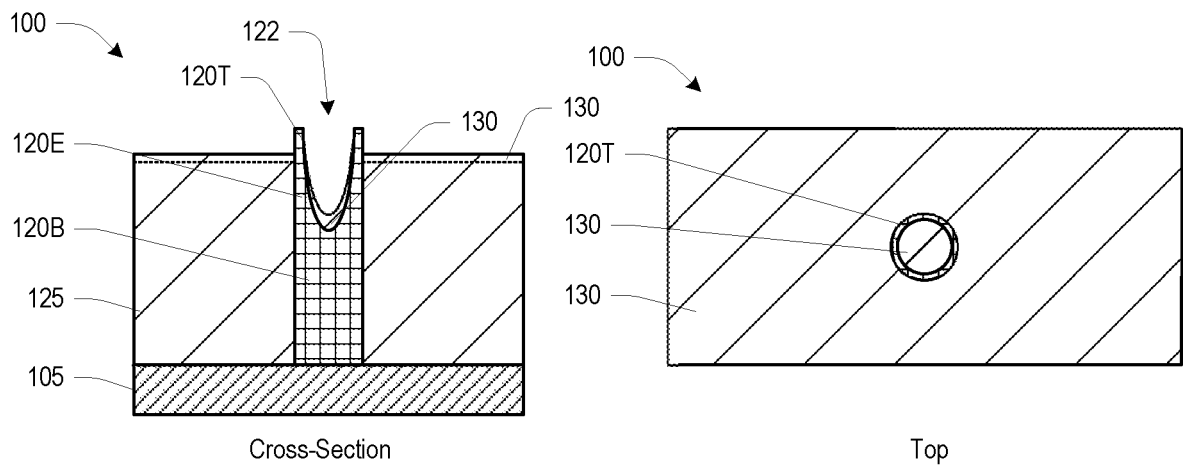

Referring to FIG. 1F, a dielectric layer 130 is formed in the recess 122, in accordance with some embodiments. The dielectric layer 130 may comprise the same material or a different material as the dielectric layer 125. The dielectric layer 130 may be formed by at least one of LPCVD, ALCVD, spin-on technology, or other suitable techniques. A portion of the dielectric layer 130 may be formed over the dielectric layer 125 such that an interface is defined between the dielectric layer 125 and the dielectric layer 130, as designated by the dashed line. A recess etch may be performed after forming the dielectric layer 130 to control the thickness of the dielectric layer 130 in the recess 122 and/or over the dielectric layer 125. At least some of the dielectric layer 130 over the tip portion 120T of the edge portion 120E may be removed, such as by the recess etch, to expose at least some of the tip portion 120T of the electrode 120.

Figure 1G:
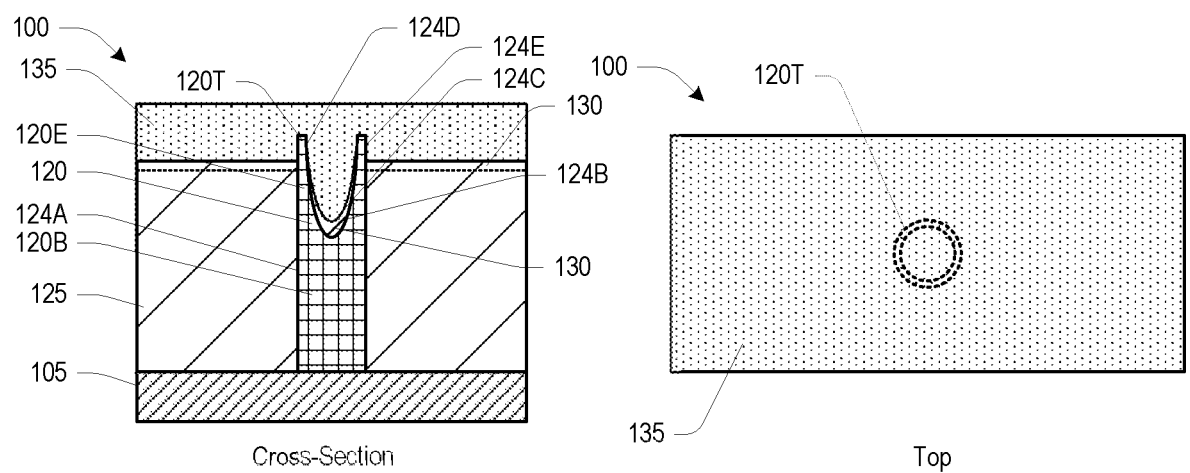

Referring to FIG. 1G, a phase change material 135 is formed over the dielectric layer 130, in the recess 122, and over the exposed portion of the edge portion 120E, such as the tip portion 120T, in accordance with some embodiments. The phase change material 135 comprises germanium-antimony-tellurium (GeSbTe or GST), a superlattice periodic structure dielectric, and/or other suitable materials. The tip portion 120T of the edge portion 120E is embedded in or surrounded by the phase change material 135, in some embodiments. An uppermost surface of the electrode 120, such as at the tip portion 120T, is at least one of above an uppermost surface of the dielectric layer 125, above an uppermost surface of the dielectric layer 130, or above a lowermost surface of the phase change material 135.

At an interface 124A, a first portion of an outer sidewall of the electrode 120 faces an inner sidewall of the dielectric layer 125. The interface 124A extends around the periphery of the electrode 120. At an interface 124B, a first portion of an inner sidewall of the edge portion 120E of the electrode 120 faces an outer sidewall of the dielectric layer 130. The interface 124B extends around the periphery of the outer sidewall of the dielectric layer 130. The inner sidewall of the edge portion 120E of the electrode 120 has a non-uniform slope as measured in a direction moving from the base portion 120B to the tip portion 120T. At an interface 124C, an inner sidewall of the dielectric layer 130 faces a first portion of an outer sidewall of the phase change material 135. The interface 124C extends around the periphery of the first portion of the outer sidewall of the phase change material 135. At an interface 124D, a second portion of the inner sidewall of the edge portion 120E of the electrode 120 (proximate the tip portion 120T) faces a second portion of the outer sidewall of the phase change material 135. The interface 124D extends around the periphery of the second portion of the outer sidewall of the phase change material 135. At an interface 124E, a second portion of the outer sidewall of the electrode 120 faces an inner sidewall of the phase change material 135. The interface 124E extends around the periphery of the second portion of the outer sidewall of the electrode 120.

Figure 1H:
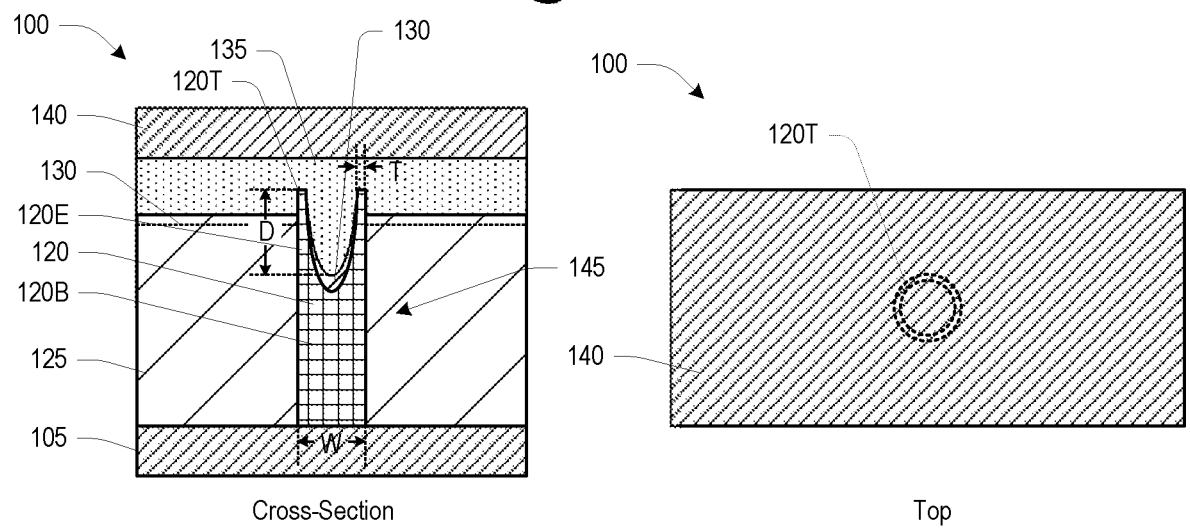

Referring to FIG. 1H, an upper conductive structure 140 is formed over the phase change material 135, in accordance with some embodiments. The upper conductive structure 140 may comprise the same material or a different material as the lower conductive structure 105. The upper conductive structure 140 may comprise a conductive line or a conductive via.

The lower conductive structure 105, the electrode 120, the phase change material 135, and the upper conductive structure 140 define a memory cell 145, according to some embodiments. The phase change material 135 has an amorphous state and a crystalline state. A first current applied to memory cell 145 transitions the phase change material 135 from the amorphous state to the crystalline state to set the binary state of the memory cell 145 to a logic 1. A second current higher than the first current applied to the memory cell 145 resets the phase change material 135 back to the amorphous state to set the binary state of the memory cell 145 to a logic 0. In some embodiments, such a reset current is less than 100 µA. The edge portion 120E and the tip portion 120T have a cross-sectional area less than the cross-sectional area of the base portion 120B. As a result of the reduced cross-sectional areas of the edge portion 120E and the tip portion 120T relative to the base portion 120B, the density or concentration of current flowing through the electrode 120 is increased in the tip portion 120T that is embedded in the phase change material 135. Increasing the current in the tip portion 120T results in a lower current required to reset the memory cell 145 as compared to a structure having an electrode that does not have an edge portion and a tip portion with reduced cross-sectional areas relative to a base portion, thereby increasing performance and allowing scaling to smaller device nodes. The tip portion 120T has a thickness. T, of about 1-10 nm, such as about 4 nm. The extension, D, of the phase change material 135 into the edge portion 120E is about 10-40 nm, such as about 25 nm. The width, W, of the base portion 110B is about 10-50 nm, such as about 30 nm. In some embodiments, a W:D ratio is between about 1:1-10:1. Other structures and/or configurations of the electrode 120 are within the scope of the present disclosure.

Figure 2A:
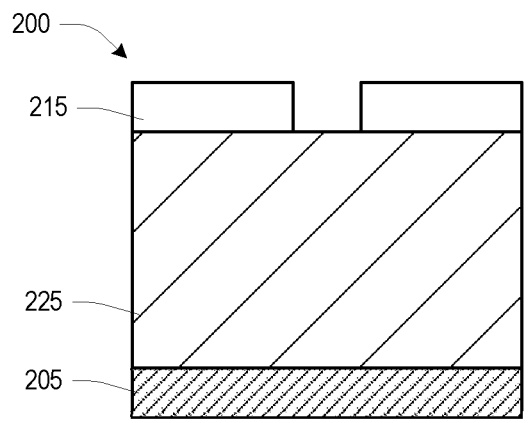
FIGS. 2A-2I are illustrations of a semiconductor structure at various stages of fabrication, in accordance with some embodiments.
Figure 2A:
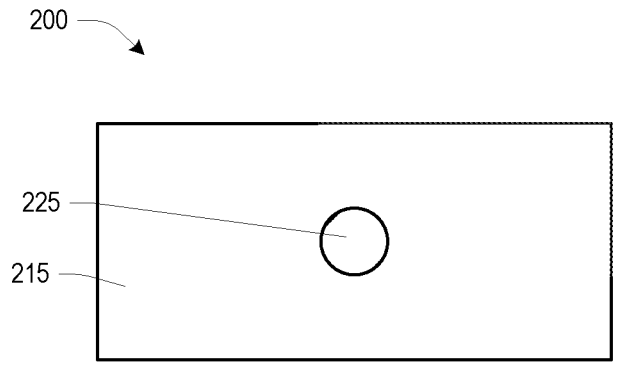

FIGS. 2A-2I are illustrations of a semiconductor structure 200 at various stages of fabrication, in accordance with some embodiments. FIGS. 2A-2I include cross-sectional views and top views of the semiconductor structure 200. Referring to FIG. 2A, a lower conductive structure 205 is formed, a dielectric layer 225 is formed over the lower conductive structure 205, and a mask 215 is formed over the dielectric layer 225. In some embodiments, the lower conductive structure 205 comprises a metallization layer, a barrier layer, a seed layer, a metal fill layer, and/or other suitable layers. According to some embodiments, the lower conductive structure 205 includes one or more active devices, such as transistors, resistors, and/or other devices, formed in one or more layers with one or more layers of metal interconnecting at least some of the active devices. In some embodiments, the lower conductive structure 205 comprises tungsten, aluminum, copper, cobalt, and/or other suitable materials. The one or more layers of the lower conductive structure 205 may be formed by at least one of ALD, PVD, CVD, thermal evaporation, plating, or other suitable techniques. The dielectric layer 225 comprises silicon dioxide, a low-k dielectric material, one or more layers of low-k dielectric material, and/or other suitable materials. The materials for the dielectric layer 225 comprise at least one of Si, O, C, or H, such as SiCOH and SiOC, or other suitable materials. Organic material such as polymers may be used for the dielectric layer 225. The dielectric layer 225 may comprise at least one of a carbon-containing material, organo-silicate glass, a porogen-containing material, nitrogen, or other suitable materials. The dielectric layer 225 may be formed by at least one of LPCVD, ALCVD, spin-on technology, or other suitable techniques. In some embodiments, the mask 215 is formed using at least one of a hard mask layer, a BARC layer, an OPL, or a photoresist layer comprising materials and/or formed as described herein.

Figure 2B:
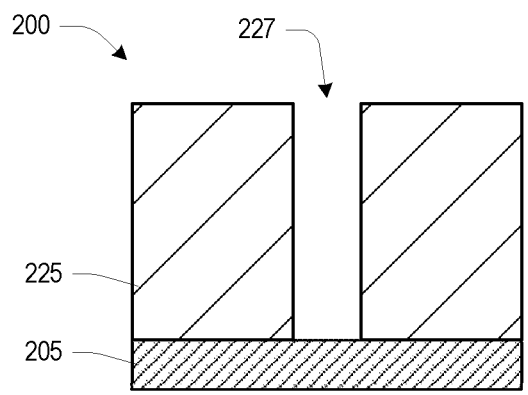
Figure 2B:
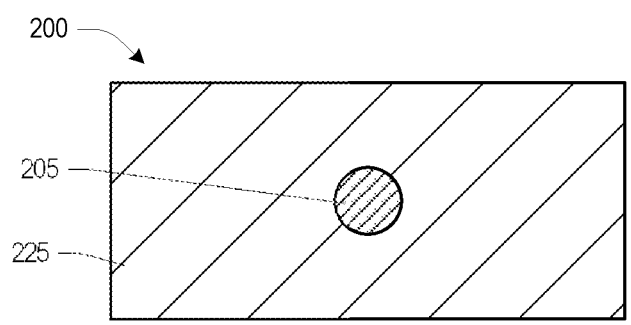

Referring to FIG. 2B, a recess 227 is formed in the dielectric layer 225 using the mask 215 as a template, and the mask 215 is removed, in accordance with some embodiments. The mask 215 may be removed by acid washing, a selective etch process, such as a wet etch process, and/or other suitable techniques. The recess 227 may have an elliptical cross-section, such as a circular cross-section, or a rectangular cross-section, such as a square cross-section. Other configurations of the recess 227 are within the scope of the present disclosure.

Figure 2C:
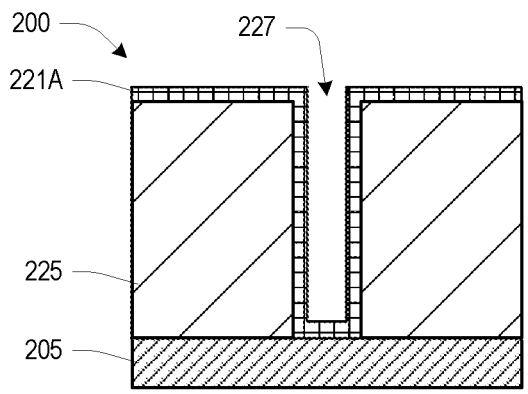
Figure 2C:
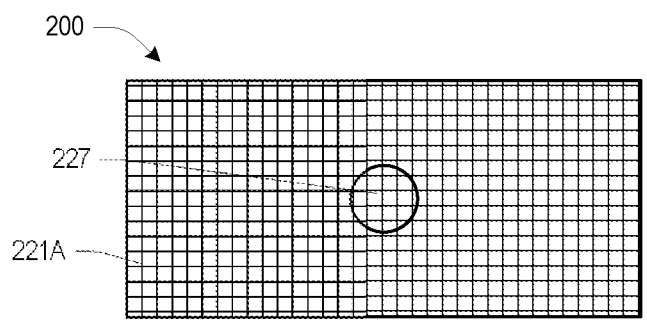

Referring to FIG. 2C, a first conductive layer 221A is formed in the recess 227 and over the dielectric layer 225, in accordance with some embodiments. The first conductive layer 221A may comprise at least one of TiN, TaN, TiSiN, fullerenes, graphene, or other suitable materials. The first conductive layer 221A may be formed by at least one of ALD, PVD, CVD, thermal evaporation, or other suitable techniques. According to some embodiments, the first conductive layer 221A is conformal such that a thickness of the first conductive layer 221A is substantially uniform or constant across surfaces of the lower conductive structure 205 and the dielectric layer 225.

Figure 2D:
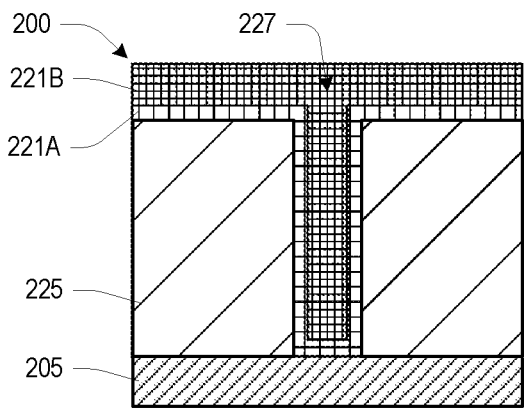
Figure 2D:
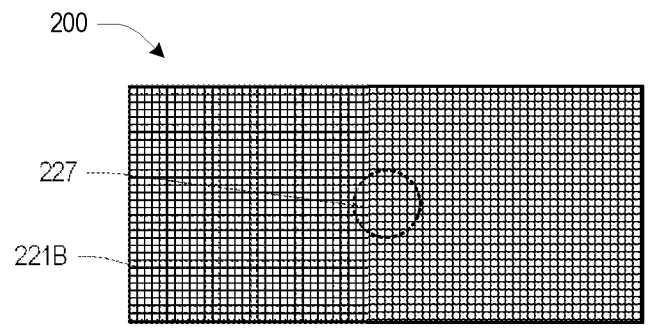

Referring to FIG. 2D, a second conductive layer 221B is formed in the recess 227 and over the first conductive layer 221A, in accordance with some embodiments. The second conductive layer 221B may comprise at least one of TiN, TaN, TiSiN, fullerenes, graphene, or other suitable materials. The second conductive layer 221B may be formed by at least one of ALD. PVD, CVD, thermal evaporation, or other suitable techniques. The second conductive layer 221B comprises a material that differs from the material of the first conductive layer 221A to provide etch selectivity, such that second conductive layer 221B is etched at a different rate than the first conductive layer 221A by a same etchant.

Figure 2E:
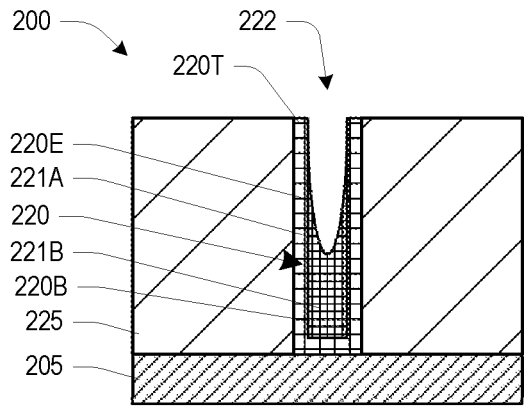
Figure 2E:
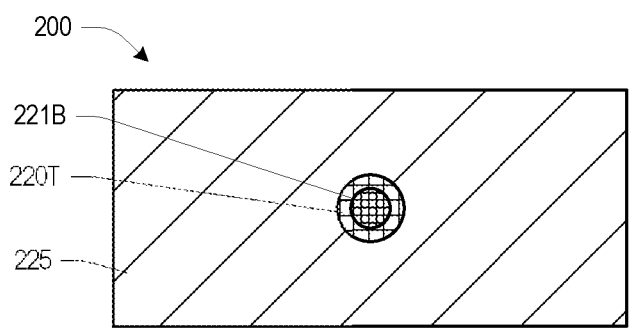

Referring to FIG. 2E, a planarization process is performed to remove portions of the first conductive layer 221A and the second conductive layer 221B over the dielectric layer 225, and the second conductive layer 221B is recessed, in accordance with some embodiments. The second conductive layer 221B may be recessed using a non-uniform etch process, such as at least one of etching with silicon tetrafluoride ($SiF_4$), etching with hydrogen chloride ($HCl_2$), etching with hydrogen sulfide ($H_2S$), etching with silicon tetrachloride (SiCl₄), etching with oxygen (02), etching with nitrogen (N₂), etching with chlorine (Cl₂), wet etching, or other suitable techniques. A recess 222 is formed in the second conductive layer 221B. According to some embodiments, the recess 222 bounded by the first conductive layer 221A and an upper surface of the second conductive layer 221B. The recess 222 may have a tapered sidewall with a non-uniform slope as a result of the non-uniform etch process. The first conductive layer 221A and the second conductive layer 221B define an electrode 220. The electrode 220 comprises a base portion 220B and an edge portion 220E extending from the base portion 220B and terminating in a tip portion 220T.

Figure 2F:
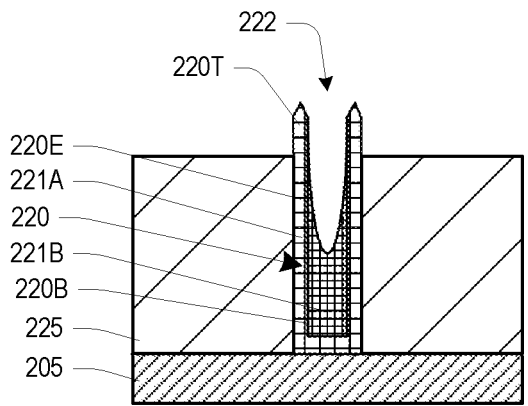
Figure 2F:
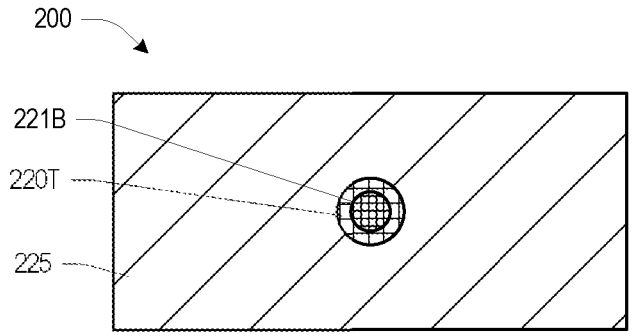

Referring to FIG. 2F, the dielectric layer 225 is recessed, in accordance with some embodiments. In some embodiments, an etch process, such as a reactive ion etch, is performed to recess the dielectric layer 225. The etch process may be a timed etch that is configured to terminate after exposing a desired portion of the edge portion 220E. In some embodiments, the etch process to recess the dielectric layer 225 erodes the first conductive layer 221A causing a tapering of the tip portion 220T.

Figure 2G:
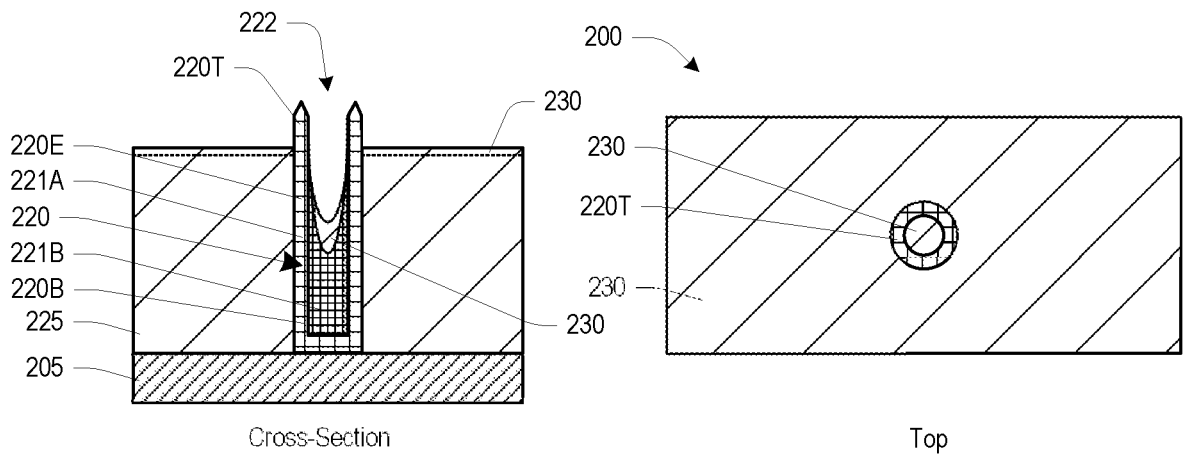

Referring to FIG. 2G, a dielectric layer 230 is formed in the recess 222, in accordance with some embodiments. The dielectric layer 230 may comprise the same material or a different material as the dielectric layer 225. The dielectric layer 230 may be formed by at least one of LPCVD, ALCVD, spin-on technology, or other suitable techniques. A portion of the dielectric layer 230 may be formed over the dielectric layer 225 such that an interface is defined between the dielectric layer 225 and the dielectric layer 230, as designated by the dashed line. A recess etch may be performed after forming the dielectric layer 230 to control the thickness of the dielectric layer 230 in the recess 222 and/or over the dielectric layer 225. At least some of the dielectric layer 230 over the tip portion 220T of the edge portion 220E may be removed, such as by the recess etch, to expose at least some of the tip portion 220T of the electrode 220.

Figure 2H:
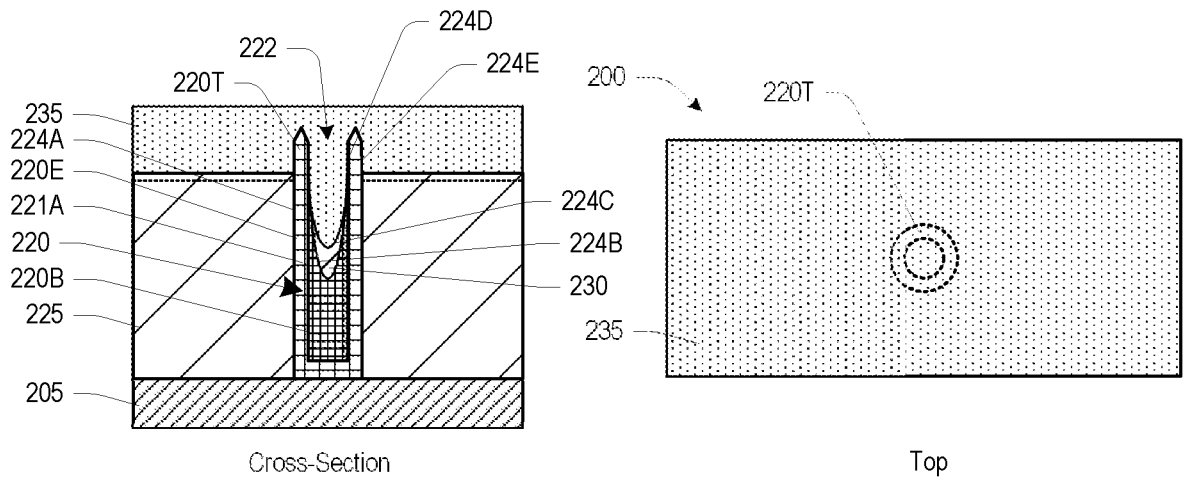

Referring to FIG. 2H, a phase change material 235 is formed over the dielectric layer 230, in the recess 222, and over the exposed portion of the edge portion 220E, such as the tip portion 220T, in accordance with some embodiments. The phase change material 235 comprises germanium-antimony-tellurium (GeSbTe or GST), a superlattice periodic structure dielectric, and/or other suitable materials. The tip portion 220T of the edge portion 220E is embedded in or surrounded by the phase change material 235, in some embodiments. An uppermost surface of the electrode 220, such as at the tip portion 220T, is at least one of above an uppermost surface of the dielectric layer 225, above an uppermost surface of the dielectric layer 230, or above a lowermost surface of the phase change material 235.

At an interface 224A, a first portion of an outer sidewall of the electrode 220 faces an inner sidewall of the dielectric layer 225. The interface 224A extends around the periphery of the electrode 220. At an interface 224B, a first portion of an inner sidewall of the edge portion 220E of the electrode 220 faces an outer sidewall of the dielectric layer 230. The interface 224B extends around the periphery of the outer sidewall of the dielectric layer 230. The inner sidewall of the edge portion 220E of the electrode 220 has a non-uniform slope as measured in a direction moving from the base portion 220B to the tip portion 220T. At an interface 224C, an inner sidewall of the dielectric layer 230 faces a first portion of an outer sidewall of the phase change material 235. The interface 224C extends around the periphery of the first portion of the outer sidewall of the phase change material 235. At an interface 224D, a second portion of the inner sidewall of the edge portion 220E of the electrode 220 (proximate the tip portion 220T) faces a second portion of the outer sidewall of the phase change material 235. The interface 224D extends around the periphery of the second portion of the outer sidewall of the phase change material 235. At an interface 224E, a second portion of the outer sidewall of the electrode 220 faces an inner sidewall of the phase change material 235. The interface 224E extends around the periphery of the second portion of the outer sidewall of the electrode 220.

Figure 2I:
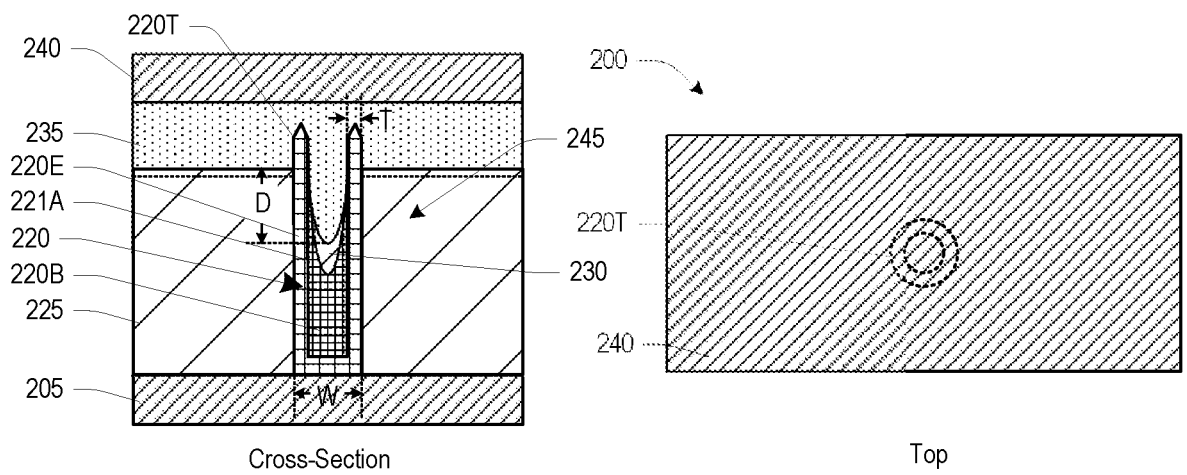

Referring to FIG. 2I, an upper conductive structure 240 is formed over the phase change material 235, in accordance with some embodiments. The upper conductive structure 240 may comprise the same material or a different material as the lower conductive structure 205. The upper conductive structure 240 may comprise a conductive line or a conductive via.

The lower conductive structure 205, the electrode 220, the phase change material 235, and the upper conductive structure 240 define a memory cell 245, according to some embodiments. The phase change material 235 has an amorphous state and a crystalline state. A first current applied to memory cell 245 transitions the phase change material 235 from the amorphous state to the crystalline state to set the binary state of the memory cell 245 to a logic 1. A second current higher than the first current applied to the memory cell 245 resets the phase change material 235 back to the amorphous state to set the binary state of the memory cell 245 to a logic 0. In some embodiments, such a reset current is less than 100 µA. The edge portion 220E and the tip portion 220T have a cross-sectional area less than the cross-sectional area of the base portion 220B. As a result of the reduced cross-sectional areas of the edge portion 220E and the tip portion 220T relative to the base portion 220B, the density or concentration of current flowing through the electrode 220 is increased in the tip portion 220T that is embedded in the phase change material 235. Increasing the current in the tip portion 120T results in a lower current required to reset the memory cell 245 as compared to a structure having an electrode that does not have an edge portion and a tip portion with reduced cross-sectional areas relative to a base portion, thereby increasing performance and allowing scaling to smaller device nodes. The tip portion 220T has a thickness, T. of about 1-10 nm, such as about 4 nm. The extension, D, of the phase change material 235 into the edge portion 220E is about 10-40 nm, such as about 25 nm. The width, W, of the base portion 210B is about 10-50 nm, such as about 30 nm. In some embodiments, a W:D ratio between about 1:1-10:1. Other structures and/or configurations of the electrode 220 are within the scope of the present disclosure.

Figure 2J:
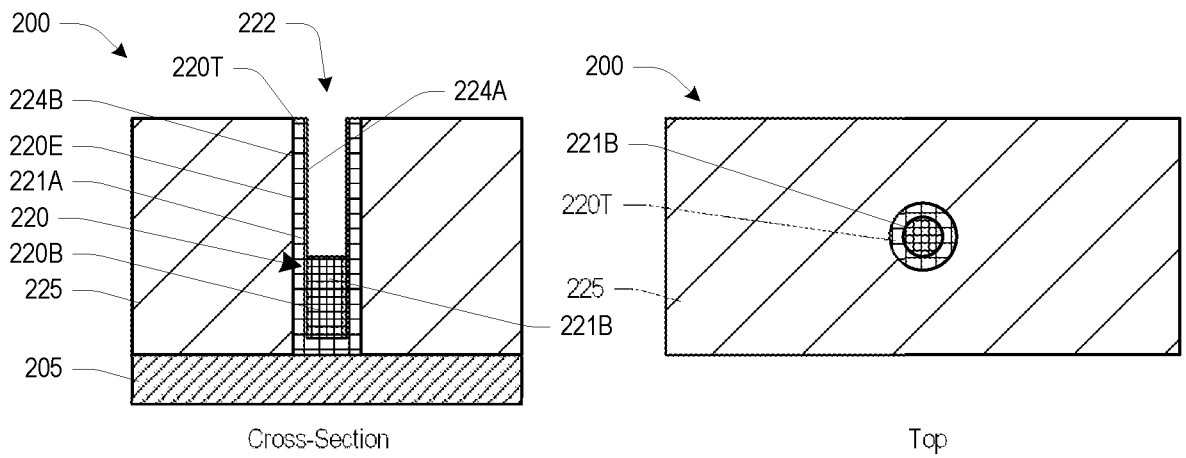
FIGS. 2J-2N are illustrations of a semiconductor structure at various stages of fabrication, in accordance with some embodiments.

FIGS. 2J-2N are illustrations of a semiconductor structure 200 at various stages of fabrication, in accordance with some embodiments. The process flow of FIGS. 2J-2N starts with the semiconductor structure illustrated in FIG. 2D. Referring to FIG. 2J, a planarization process is performed to remove portions of the first conductive layer 221A and the second conductive layer 221B over the dielectric layer 225, and the second conductive layer 221B is recessed, in accordance with some embodiments. The second conductive layer 221B is recessed using a uniform or anisotropic etch process, such as a plasma etch process, a reactive ion etch process, or other suitable techniques. A recess 222 bounded by the first conductive layer 221A and an upper surface of the second conductive layer 221B is formed. The first conductive layer 221A and the second conductive layer 221B define an electrode 220. The electrode 220 comprises a base portion 220B and an edge portion 220E extending from the base portion 220B and terminating in a tip portion 220T.

Figure 2K:
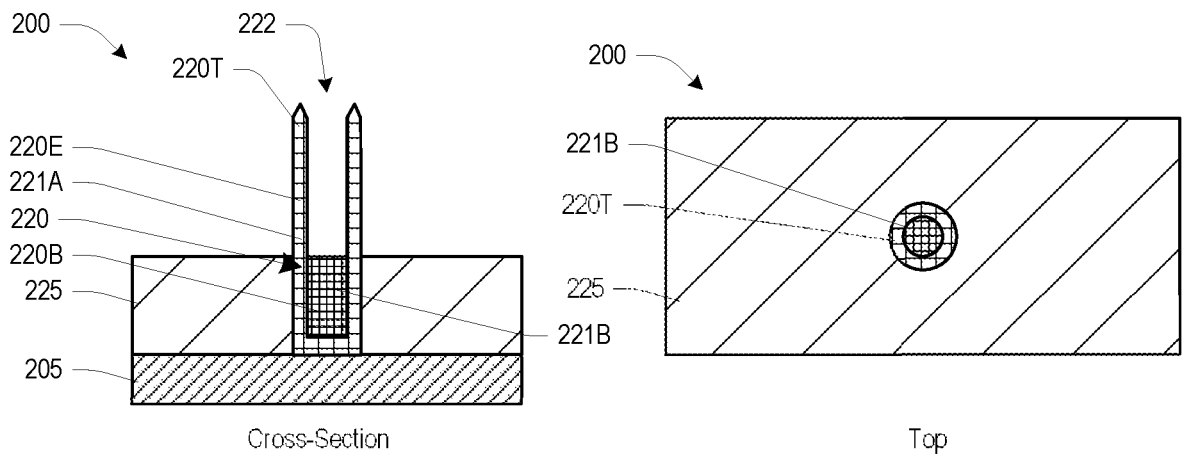

Referring to FIG. 2K, the dielectric layer 225 is recessed, in accordance with some embodiments. In some embodiments, an etch process, such as a reactive ion etch, is performed to recess the dielectric layer 225. The etch process may be a timed etch that it is configured to terminate after exposing a desired portion of the edge portion 220E. In some embodiments, the etch process to recess the dielectric layer 225 erodes the first conductive layer 221A causing a tapering of the tip portion 220T.

Figure 2L:
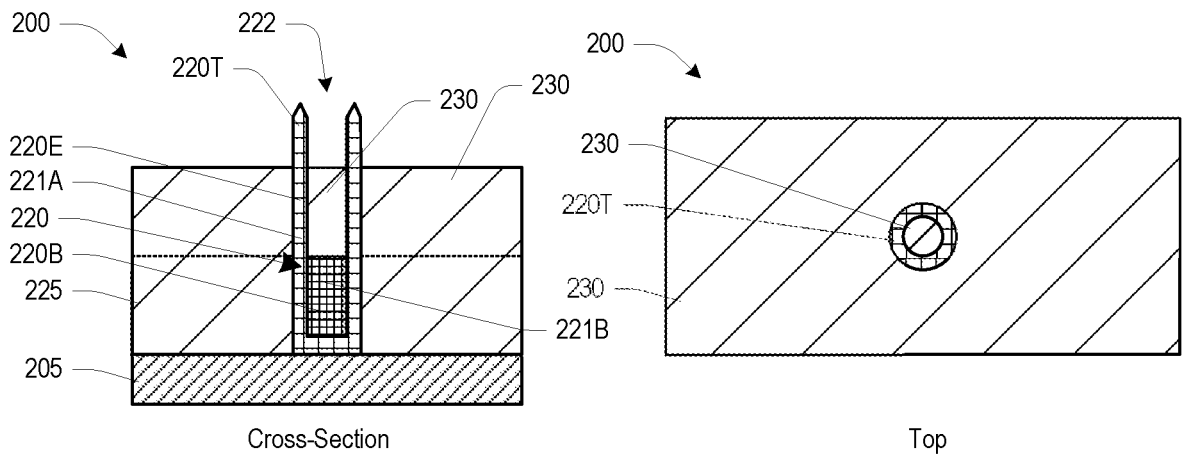

Referring to FIG. 2L, a dielectric layer 230 is formed in the recess 222, in accordance with some embodiments. The dielectric layer 230 may comprise the same material or a different material as the dielectric layer 225. A portion of the dielectric layer 230 may be formed over the dielectric layer 225 such that an interface is defined between the dielectric layer 225 and the dielectric layer 230, as designated by the dashed line. A recess etch may be performed after forming the dielectric layer 230 to control the thickness of the dielectric layer 230 in the recess 222 and/or over the dielectric layer 225. At least some of the dielectric layer 230 over the tip portion 220T of the edge portion 220E may be removed, such as by the recess etch, to expose at least some of the tip portion 220T of the electrode 220.

Figure 2M:
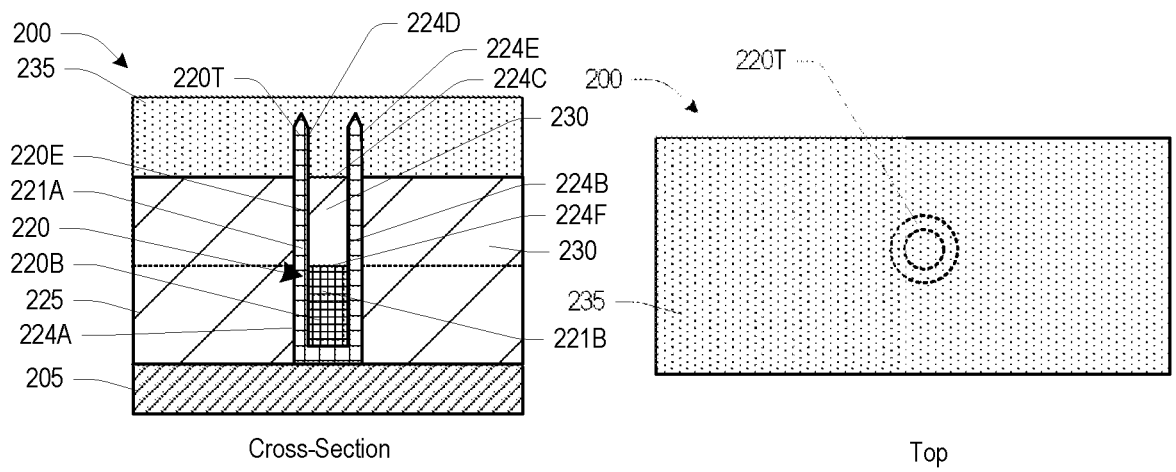

Referring to FIG. 2M, a phase change material 235 is formed over the dielectric layer 230, in the recess 222, and over the exposed portion of the edge portion 220E, such as the tip portion 220T, in accordance with some embodiments. The phase change material 235 comprises germanium-antimony-tellurium (GeSbTe or GST), a superlattice periodic structure dielectric, and/or other suitable materials. The tip portion 220T of the edge portion 220E is embedded in or surrounded by the phase change material 235, in some embodiments. An uppermost surface of the electrode 220, such as at the tip portion 220T, is at least one of above an uppermost surface of the dielectric layer 225, above an uppermost surface of the dielectric layer 230, or above a lowermost surface of the phase change material 235.

At an interface 224A, a first portion of an outer sidewall of the electrode 220 faces an inner sidewall of the dielectric layer 225. The interface 224A extends around the periphery of the electrode 220. At an interface 224B, a first portion of an inner sidewall of the edge portion 220E of the electrode 220 faces an outer sidewall of the dielectric layer 230. The interface 224B extends around the periphery of the outer sidewall of the dielectric layer 230. At an interface 224C, an upper surface of the dielectric layer 230 faces a lower surface of the phase change material 235. The interface 224C between the upper surface of the dielectric layer 230 and the lower surface of the phase change material 235 is generally uniform or flat or non-tapered. At an interface 224D, a second portion of the inner sidewall of the edge portion 220E of the electrode 220 (proximate the tip portion 220T) faces an outer sidewall of the phase change material 235. The interface 224D extends around the periphery of the outer sidewall of the phase change material 235. At an interface 224E, a second portion of the outer sidewall of the electrode 220 faces an inner sidewall of the phase change material 235. The interface 224E extends around the periphery of the second portion of the outer sidewall of the electrode 220. At an interface 224F, an upper surface of the second conductive layer 221B faces a lower surface of the dielectric layer 230. The interface 224F between the upper surface of the second conductive layer 221B and the lower surface of the dielectric layer 230 is generally uniform or flat or non-tapered.

Figure 2N:
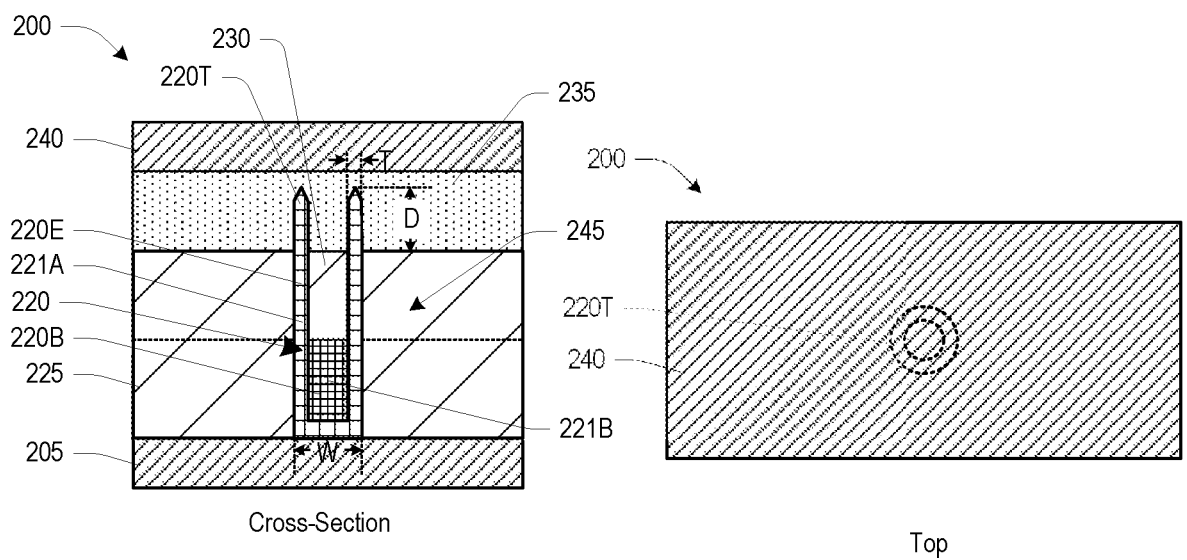

Referring to FIG. 2N, an upper conductive structure 240 is formed over the phase change material 235, in accordance with some embodiments. The upper conductive structure 240 may comprise the same material or a different material as the lower conductive structure 205. The upper conductive structure 240 may comprise a conductive line or a conductive via.

The lower conductive structure 205, the electrode 220, the phase change material 235, and the upper conductive structure 240 define a memory cell 245, according to some embodiments. The phase change material 235 has an amorphous state and a crystalline state. A first current applied to memory cell 245 transitions the phase change material 235 from the amorphous state to the crystalline state to set the binary state of the memory cell 245 to a logic 1. A second current higher than the first current applied to the memory cell 245 resets the phase change material 235 back to the amorphous state to set the binary state of the memory cell 245 to a logic 0. In some embodiments, such a reset current is less than 100 µA. The edge portion 220E and the tip portion 220T have a cross-sectional area less than the cross-sectional area of the base portion 220B. As a result of the reduced cross-sectional areas of the edge portion 220E and the tip portion 220T relative to the base portion 220B, the density or concentration of current flowing through the electrode 220 is increased in the tip portion 220T that is embedded in the phase change material 235. Increasing the current in the tip portion 220T results in a lower current required to reset the memory cell 245 as compared to a structure having an electrode that does not have an edge portion and a tip portion with reduced cross-sectional areas relative to a base portion, thereby increasing performance and allowing scaling to smaller device nodes. The tip portion 220T has a thickness, T, of about 1-10 nm, such as about 4 nm. The extension, D, of the phase change material 235 into the edge portion 220E is about 10-40 nm, such as about 25 nm. The width, W, of the base portion 210B is about 10-50 nm, such as about 30 nm. In some embodiments, a W:D ratio between about 1:1-10:1. Other structures and/or configurations of the electrode 220 are within the scope of the present disclosure.

Figure 3A:
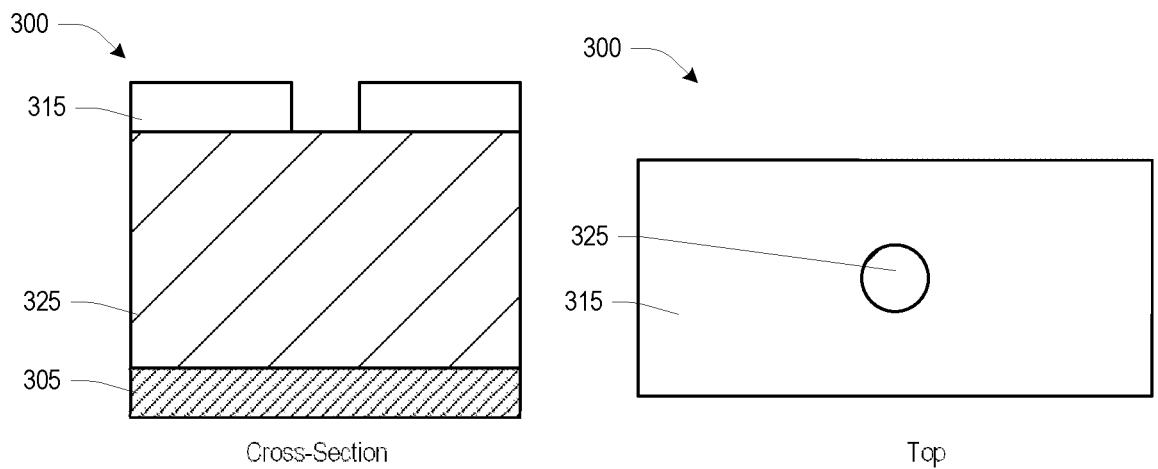
FIGS. 3A-3H are illustrations of a semiconductor structure at various stages of fabrication, in accordance with some embodiments.

FIGS. 3A-3I are illustrations of a semiconductor structure 300 at various stages of fabrication, in accordance with some embodiments. FIGS. 3A-3I include cross-sectional views and top views of the semiconductor structure 300. Referring to FIG. 3A, a lower conductive structure 305 is formed, a dielectric layer 325 is formed over the lower conductive structure 305, and a mask 315 is formed over the dielectric layer 325. In some embodiments, the lower conductive structure 305 comprises a metallization layer, a barrier layer, a seed layer, a metal fill layer, and/or other suitable layers. According to some embodiments, the lower conductive structure 305 includes one or more active devices, such as transistors, resistors, and/or other devices, formed in one or more layers with one or more layers of metal interconnecting at least some of the active devices. In some embodiments, the lower conductive structure 305 comprises tungsten, aluminum, copper, cobalt, and/or other suitable materials. The one or more layers of the lower conductive structure 305 may be formed by at least one of ALD, PVD, CVD, thermal evaporation, plating, or other suitable techniques. The dielectric layer 325 comprises silicon dioxide, a low-k dielectric material, one or more layers of low-k dielectric material, and/or other suitable materials. The materials for the dielectric layer 325 comprise at least one of Si, O, C, or H, such as SiCOH and SiOC, or other suitable materials. Organic material such as polymers may be used for the dielectric layer 325. The dielectric layer 325 may comprise at least one of a carbon-containing material, an organo-silicate glass, a porogen-containing material, nitrogen, or other suitable materials. The dielectric layer 325 may be formed by at least one of LPCVD, ALCVD, spin-on technology, or other suitable techniques. In some embodiments, the mask 315 is formed using at least one of a hard mask layer, a BARC layer, an OPL, or a photoresist layer comprising materials and/or formed as described herein.

Figure 3B:
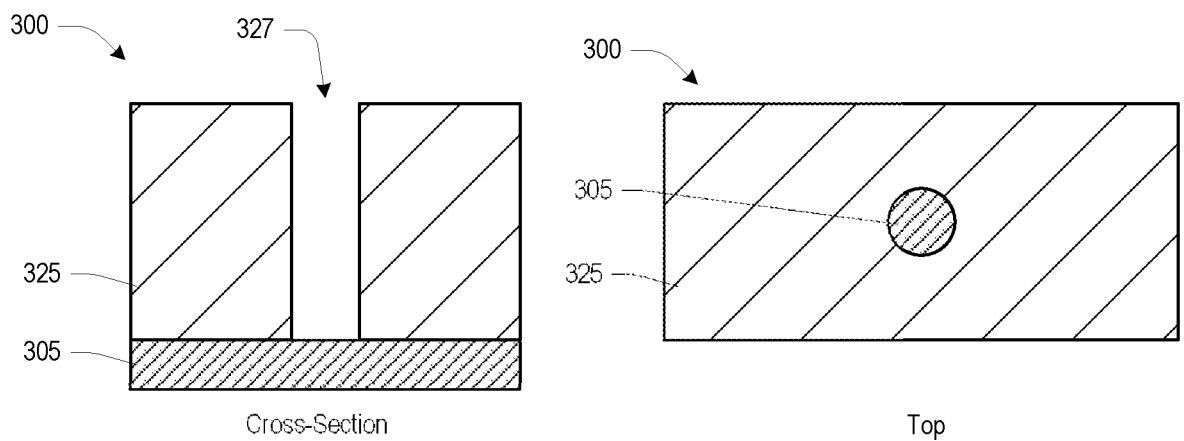

Referring to FIG. 3B, a recess 327 is formed in the dielectric layer 325 using the mask 315 as a template, and the mask 315 is removed, in accordance with some embodiments. The mask 315 may be removed by acid washing, a selective etch process, such as a wet etch process, and/or other suitable techniques. The recess 327 may have an elliptical cross-section, such as a circular cross-section, or a rectangular cross-section, such as a square cross-section. Other configurations of the recess 327 are within the scope of the present disclosure.

Figure 3C:
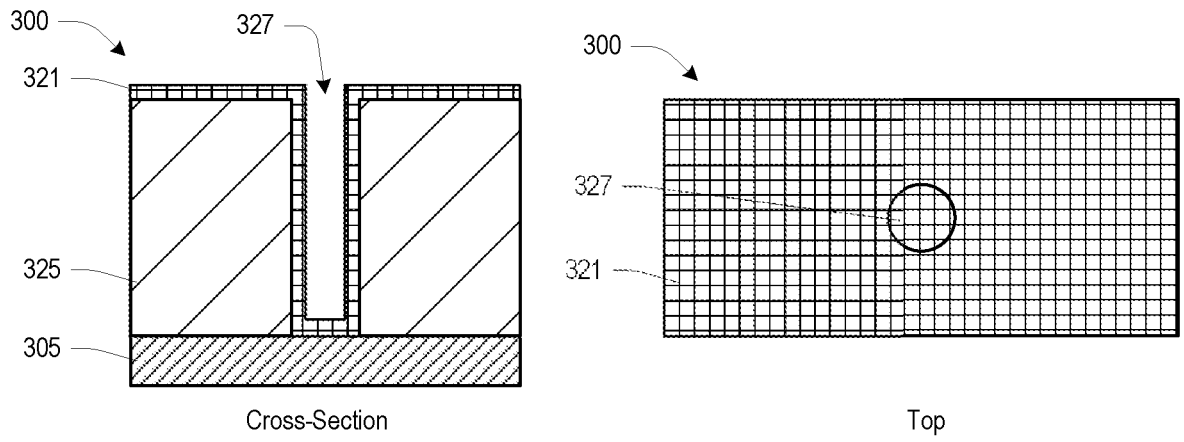

Referring to FIG. 3C, a conductive layer 321 is formed in the recess 327 and over the dielectric layer 325, in accordance with some embodiments. The conductive layer 321 may comprise at least one of TiN, TaN, TiSiN, fullerenes, graphene, or other suitable materials. The conductive layer 321 may be formed by at least one of ALD, PVD. CVD, thermal evaporation, or other suitable techniques. According to some embodiments, the conductive layer 321 is conformal such that a thickness of the conductive layer 321 is substantially uniform or constant across surfaces of the lower conductive structure 305 and the dielectric layer 325.

Figure 3D:
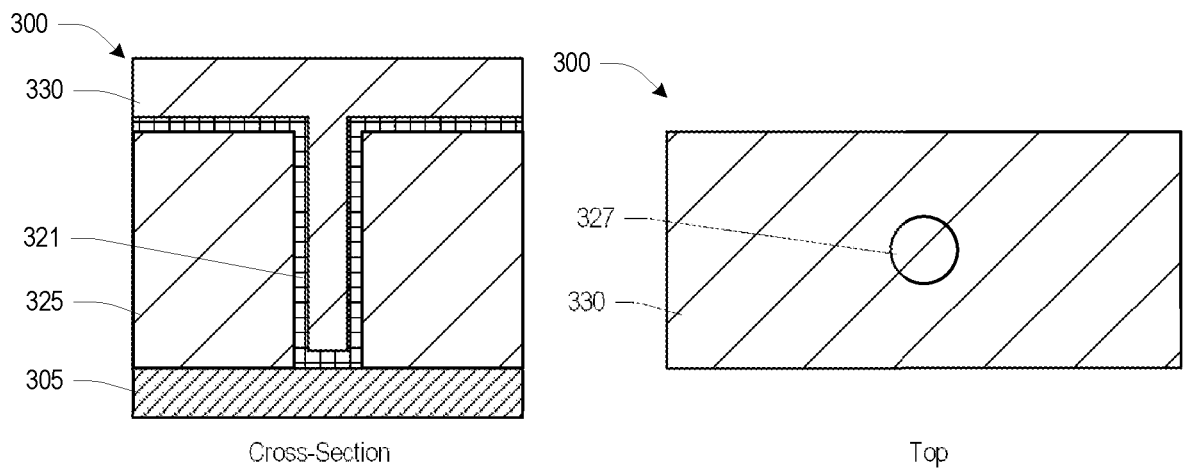

Referring to FIG. 3D, a dielectric layer 330 is formed in the recess 227 and over the conductive layer 321, in accordance with some embodiments. The dielectric layer 330 may comprise the same material or a different material as the dielectric layer 325. The dielectric layer 330 may be formed by at least one of LPCVD. ALCVD, spin-on technology, or other suitable techniques.

Figure 3E:
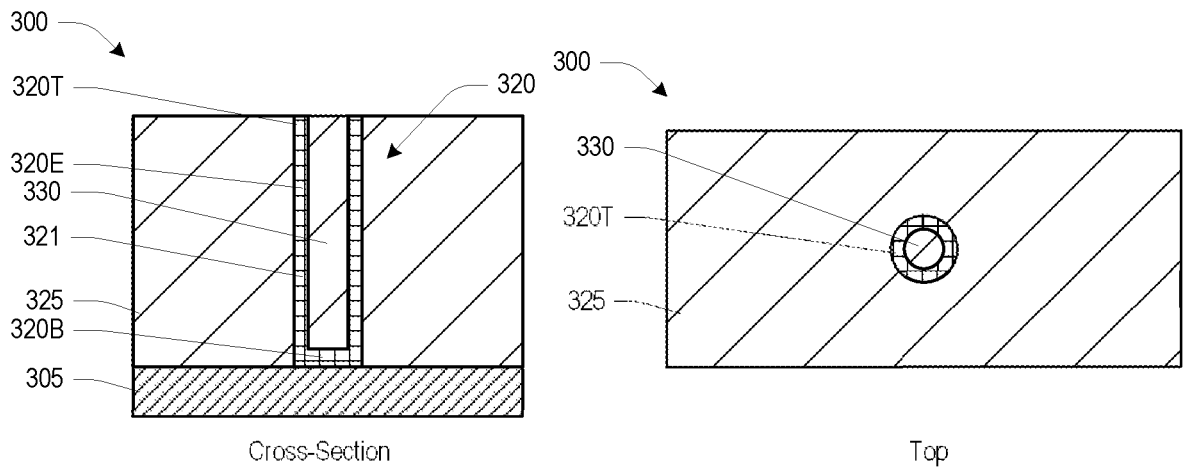

Referring to FIG. 3E, a planarization process is performed to remove portions of the dielectric layer 330 and the conductive layer 321 over the dielectric layer 325, in accordance with some embodiments. The conductive layer 321 defines an electrode 320. The electrode 320 comprises a base portion 320B and an edge portion 320E extending from the base portion 320B and terminating in a tip portion 320T. The planarization process may include a reactive ion etch, a wet etch, a chemical mechanical planarization (CMP), and/or other suitable techniques.

Figure 3F:
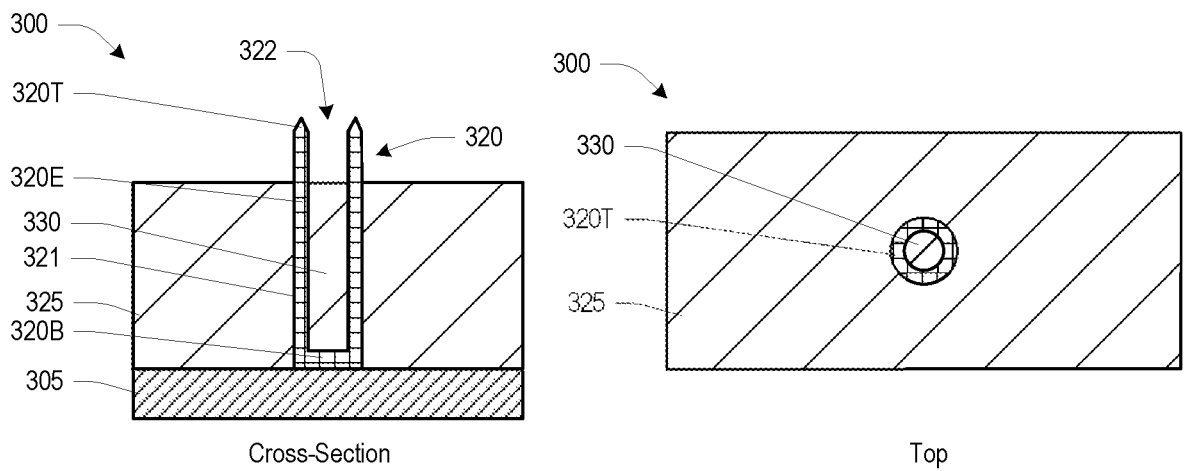

Referring to FIG. 3F, the dielectric layer 325 and the dielectric layer 330 are recessed, in accordance with some embodiments. In some embodiments, an anisotropic etch process, such as a reactive ion etch, is performed to recess the dielectric layer 325 and the dielectric layer 330. The etch process may be a timed etch that is configured to terminate after exposing a desired portion of the edge portion 320E of the electrode 320, thereby defining a recess 322. In some embodiments, the etch process to recess the dielectric layer 325 and the dielectric layer 330 erodes the conductive layer 321 causing a tapering of the tip portion 320T.

Figure 3G:
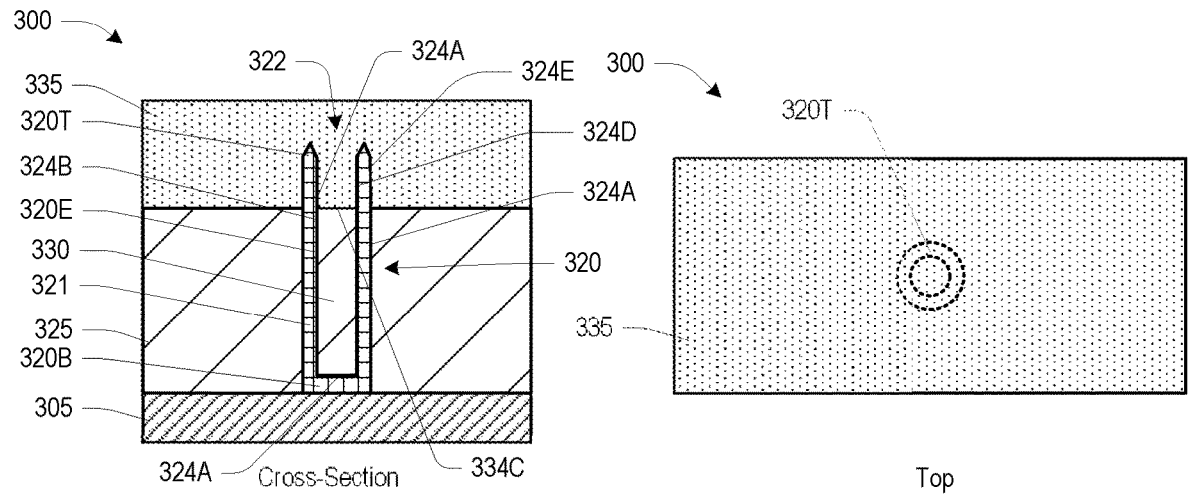

Referring to FIG. 3G, a phase change material 335 is formed over the dielectric layer 325, in the recess 322, and over the exposed portion of the edge portion 320E, such as the tip portion 320T, in accordance with some embodiments. The phase change material 335 comprises germanium-antimony-tellurium (GeSbTe or GST), a superlattice periodic structure dielectric, and/or other suitable materials. The tip portion 320T of the edge portion 320E is embedded in or surrounded by the phase change material 335, in some embodiments. An uppermost surface of the electrode 320, such as at the tip portion 320T, is at least one of above an uppermost surface of the dielectric layer 325, above an uppermost surface of the dielectric layer 330, or above a lowermost surface of the phase change material 335.

At an interface 324A, a first portion of an outer sidewall of the electrode 320 faces an inner sidewall of the dielectric layer 325. The interface 324A extends around the periphery of the electrode 320. At an interface 324B, a first portion of an inner sidewall of the edge portion 320E of the electrode 320 faces an outer sidewall of the dielectric layer 330. The interface 324B extends around the periphery of the outer sidewall of the dielectric layer 330. At an interface 324C, an upper surface of the dielectric layer 330 faces a lower surface of the phase change material 335. The interface 324C between the upper surface of the dielectric layer 330 and the lower surface of the phase change material 335 is generally uniform or flat or non-tapered. At an interface 324D, a second portion of the inner sidewall of the edge portion 320E of the electrode 320 (proximate the tip portion 320T) faces an outer sidewall of the phase change material 335. The interface 324D extends around the periphery of the outer sidewall of the phase change material 335. At an interface 324E, a second portion of the outer sidewall of the electrode 320 faces an inner sidewall of the phase change material 335. The interface 324E extends around the periphery of the second portion of the outer sidewall of the electrode 320. At an interface 324F, an upper surface of the base portion 320B of the electrode 320 faces a lower surface of the dielectric layer 330. The interface 324F between the upper surface of the base portion 320B of the electrode 320 and the lower surface of the dielectric layer 330 is generally uniform or flat or non-tapered.

Figure 3H:
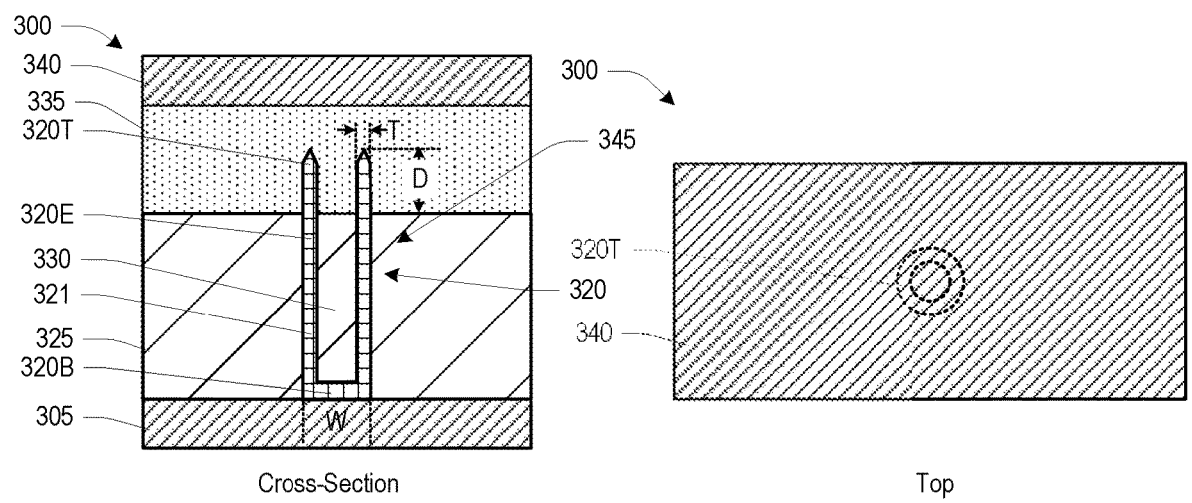

Referring to FIG. 3H, an upper conductive structure 340 is formed over the phase change material 335, in accordance with some embodiments. The upper conductive structure 340 may comprise the same material or a different material as the lower conductive structure 305. The upper conductive structure 340 may comprise a conductive line or a conductive via.

The lower conductive structure 305, the electrode 320, the phase change material 335, and the upper conductive structure 340 define a memory cell 345, according to some embodiments. The phase change material 335 has an amorphous state and a crystalline state. A first current applied to memory cell 345 transitions the phase change material 335 from the amorphous state to the crystalline state to set the binary state of the memory cell 345 to a logic 1. A second current higher than the first current applied to the memory cell 345 resets the phase change material 335 back to the amorphous state to set the binary state of the memory cell 345 to a logic 0. In some embodiments, such a reset current is less than 100 µA. The edge portion 320E and the tip portion 320T have a cross-sectional area less than the cross-sectional area of the base portion 320B. As a result of the reduced cross-sectional areas of the edge portion 320E and the tip portion 320T relative to the base portion 320B, the density or concentration of current flowing through the electrode 320 is increased in the tip portion 320T that is embedded in the phase change material 335. Increasing the current in the tip portion 320T results in a lower current required to reset the memory cell 345 as compared to a structure having an electrode that does not have an edge portion and a tip portion with reduced cross-sectional areas relative to a base portion, thereby increasing performance and allowing scaling to smaller device nodes. The tip portion 320T has a thickness, T, of about 1-10 nm, such as about 4 nm. The extension, D, of the phase change material 335 into the edge portion 320E is about 10-40 nm, such as about 25 nm. The width, W, of the base portion 310B is about 10-50 nm, such as about 30 nm. In some embodiments, a W:D ratio between about 1:1-10:1. Other structures and/or configurations of the electrode 320 are within the scope of the present disclosure.

According to some embodiments, the semiconductor structures 100, 200, 300 are formed using process nodes less than 10 nm for the electrodes 120, 220, 320. The memory cells 145, 245, 345 exhibit reset currents less than 100 μA, which is less than reset currents of structures not having differing cross-sectional areas. The tip portions 120T, 220T, 320T concentrate the current in the phase change material 135, 235, 335, thereby facilitating a reduced reset current. The reduced reset current enhances reliability and endurance (cyclability) by controlling a temperature profile and leveraging thermal boundary resistance of respective memory cells 145, 245, 345. The tip portions 120T, 220T, 320T increase thermal resistance and reduce thermal loss of respective memory cells 145, 245, 345. According to some embodiments, the fabrication techniques illustrated herein for fabricating the memory cells 145, 245, 345 employ materials and processes compatible with complementary metal-oxide-semiconductor (CMOS) devices.

In some embodiments, a semiconductor structure includes a first dielectric layer, an electrode in the first dielectric layer, a second dielectric layer in the electrode, and a phase change material over the first dielectric layer, the electrode, and the second dielectric layer. According to some embodiments, an uppermost surface of the electrode is at least one of above an uppermost surface of the first dielectric layer, above an uppermost surface of the second dielectric layer, or above a lowermost surface of the phase change material.

In some embodiments, a method includes forming an electrode, removing a portion of the electrode to define a recess in the electrode, forming a first dielectric layer in the recess, and forming a phase change material in the recess over the first dielectric layer and over the electrode such that an uppermost surface of the electrode is at least one of above an uppermost surface of the first dielectric layer or above a lowermost surface of the phase change material.

In some embodiments, a method includes forming a recess in a first dielectric layer, forming a first conductive layer in the recess to define an electrode, forming a second dielectric layer over the first conductive layer, recessing the first dielectric layer and the second dielectric layer to expose an uppermost surface of the electrode, and forming a phase change material over the first dielectric layer, the second dielectric layer, and the electrode such that an uppermost surface of the electrode is at least one of above an uppermost surface of the first dielectric layer, above an uppermost surface of the second dielectric layer, or above a lowermost surface of the phase change material.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor structure, comprising:
a first dielectric layer;
an electrode in the first dielectric layer;
a second dielectric layer in the electrode; and
a phase change material over the first dielectric layer, the electrode, and the second dielectric layer, wherein:
an uppermost surface of the electrode is at least one of:
above an uppermost surface of the first dielectric layer,
above an uppermost surface of the second dielectric layer, or
above a lowermost surface of the phase change material.

2. The semiconductor structure of claim 1, wherein the electrode comprises a first conductive layer in the first dielectric layer and a second conductive layer over the first conductive layer.

3. The semiconductor structure of claim 1, wherein:
a first portion of an outer sidewall of the electrode faces an inner sidewall of the first dielectric layer;
a first portion of an inner sidewall of the electrode faces an outer sidewall of the second dielectric layer; and
a second portion of the inner sidewall of the electrode faces a first portion of an outer sidewall of the phase change material.

4. The semiconductor structure of claim 3, wherein:
an inner sidewall of the second dielectric layer faces a second portion of the outer sidewall of the phase change material.

5. The semiconductor structure of claim 3, wherein:
a second portion of the outer sidewall of the electrode faces an inner sidewall of the phase change material.

6. The semiconductor structure of claim 1, wherein:
the electrode comprises a base portion and an edge portion extending from the base portion;
the edge portion terminates in a tip portion; and
the tip portion is embedded in the phase change material.

7. The semiconductor structure of claim 1, wherein the second dielectric layer is at least one of:
below the phase change material, or
below an uppermost surface of the first dielectric layer.

8. A method, comprising:
forming an electrode;
removing a portion of the electrode to define a recess in the electrode;
forming a first dielectric layer in the recess; and
forming a phase change material in the recess over the first dielectric layer and over the electrode such that an uppermost surface of the electrode is at least one of:
above an uppermost surface of the first dielectric layer, or
above a lowermost surface of the phase change material.

9. The method of claim 8, wherein forming the electrode comprises:
forming a layer of conductive material; and
patterning the layer of conductive material to form the electrode.

10. The method of claim 8, comprising:
forming a second dielectric layer around the electrode, such that an outer sidewall of the electrode faces an inner sidewall of the second dielectric layer.

11. The method of claim 10, comprising:
recessing the second dielectric layer such that the uppermost surface of the electrode is above an uppermost surface of the second dielectric layer.

12. The method of claim 11, comprising:
forming some of the first dielectric layer over the second dielectric layer, after recessing the second dielectric layer, when forming the first dielectric layer in the recess.

13. The method of claim 8, wherein:
the recess is defined by an inner sidewall of the electrode; and
the inner sidewall of the electrode has a non-uniform slope.

14. The method of claim 8, comprising:
forming a metal layer over the phase change material.

15. The method of claim 8, wherein forming the electrode comprises:
forming the electrode over a metal layer.

16. A method, comprising:
forming a recess in a first dielectric layer;
forming a first conductive layer in the recess to define an electrode;
forming a second dielectric layer over the first conductive layer;
recessing the first dielectric layer and the second dielectric layer to expose an uppermost surface of the electrode; and
forming a phase change material over the first dielectric layer, the second dielectric layer, and the electrode such that an uppermost surface of the electrode is at least one of:
above an uppermost surface of the first dielectric layer,
above an uppermost surface of the second dielectric layer, or
above a lowermost surface of the phase change material.

17. The method of claim 16, wherein defining the electrode comprises:
forming a second conductive layer in the recess over the first conductive layer.

18. The method of claim 16, comprising:
removing a portion of the electrode to define a second recess in the electrode before forming the second dielectric layer; and
wherein forming the second dielectric layer comprises forming the second dielectric layer in the second recess.

19. The method of claim 18, wherein forming the phase change material comprises forming the phase change material in the second recess.

20. The method of claim 18, wherein:
defining the second recess comprises removing the portion of the electrode such that the second recess is defined by an inner sidewall of the electrode; and
the inner sidewall has a non-uniform slope.

* * * * *